(12) United States Patent
Cho et al.

(10) Patent No.: US 7,817,489 B2
(45) Date of Patent: Oct. 19, 2010

(54) POWER SUPPLYING CIRCUIT AND PHASE-CHANGE RANDOM ACCESS MEMORY INCLUDING THE SAME

(75) Inventors: Beak-hyung Cho, Hwaseong-si (KR); Kwang-ho Kim, Hwaseong-si (KR); Won-seok Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 181 days.

(21) Appl. No.: 12/251,761

(22) Filed: Oct. 15, 2008

(65) Prior Publication Data
US 2009/0122601 A1  May 14, 2009

(30) Foreign Application Priority Data
Nov. 13, 2007  (KR) ...................... 10-2007-0115487

(51) Int. Cl.
*G11C 5/14*   (2006.01)
(52) U.S. Cl. ....................... 365/226; 365/227
(58) Field of Classification Search ................. 365/226, 365/227, 163, 230.03
See application file for complete search history.

(56) References Cited

U.S. PATENT DOCUMENTS 6,873,538 B2   3/2005   Hush

2008/0253215 A1*  10/2008  Akiba et al. ................. 365/227
2009/0039840 A1*   2/2009  Lee ............................. 323/266

FOREIGN PATENT DOCUMENTS

KR   10020070008216 A   1/2007
KR       100699872 B1   3/2007

* cited by examiner

*Primary Examiner*—Richard Elms
*Assistant Examiner*—Hien N Nguyen
(74) *Attorney, Agent, or Firm*—Volentine & Whitt, PLLC

(57) ABSTRACT

A power supplying circuit (PSC) and a phase-change random access memory (PRAM) including the PSC. According to an aspect of the invention, the PSC includes: a first voltage generator configured to output a first voltage to a first terminal; and a second voltage generator configured to output a second voltage to a second terminal, the second voltage generator including: a voltage pump unit configured to output the second voltage based on a clock signal and a pump control signal; a pump output detector coupled to the voltage pump unit, the pump output detector configured to output a pump output detection signal; and a discharging unit coupled to the voltage pump unit, the discharging unit configured to discharge a level of the second voltage to a predetermined level in response to a discharge signal. Embodiments of the invention may prevent write and/or read malfunctions that can occur due to changes in the level of a voltage supplied to PRAM cell blocks.

20 Claims, 4 Drawing Sheets

US 7,817,489 B2

POWER SUPPLYING CIRCUIT AND PHASE-CHANGE RANDOM ACCESS MEMORY INCLUDING THE SAME

CROSS-REFERENCE TO RELATED PATENT APPLICATION

This application claims the benefit of Korean Patent Application No. 10-2007-0115487, filed on Nov. 13, 2007, in the Korean Intellectual Property Office, the disclosure of which is incorporated herein in its entirety by reference.

SUMMARY OF THE INVENTION

Embodiments of the invention provide a power supplying circuit (PSC) and a phase-change random access memory (PRAM) including the PSC. Embodiments of the invention may prevent write and/or read malfunctions that can occur due to changes in the level of a voltage supplied to PRAM cell blocks.

According to an aspect of the invention, there is provided a power supply circuit (PSC) adapted for use in a Phase-change Random Access Memory (PRAM). The PSC includes: a first voltage generator configured to output a first voltage to a first terminal; and a second voltage generator configured to output a second voltage to a second terminal, the second voltage generator including: a voltage pump unit configured to output the second voltage based on a clock signal and a pump control signal; a pump output detector coupled to the voltage pump unit, the pump output detector configured to output a pump output detection signal; and a discharging unit coupled to the voltage pump unit, the discharging unit configured to discharge a level of the second voltage to a predetermined level in response to a discharge signal.

According to another aspect of the invention, there is provided a semiconductor memory device including: a memory cell array having a plurality of memory blocks; a plurality of switches, each of the plurality of switches connected to a corresponding one of the plurality of memory blocks; a plurality of selectors, each of the plurality of selectors coupled to a corresponding one of the plurality of switches, each of the selectors configured to output a control signal to the corresponding one of the plurality of switches in response to a block selection signal and a discharge success signal; and a power supplying circuit (PSC) coupled to each of the plurality of switches by a first line and a second line, the PSC further coupled to the plurality of selectors by a control line, the PSC configured to output a first voltage to the first line and a second voltage to a second line.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION OF THE INVENTION

Figure 1:
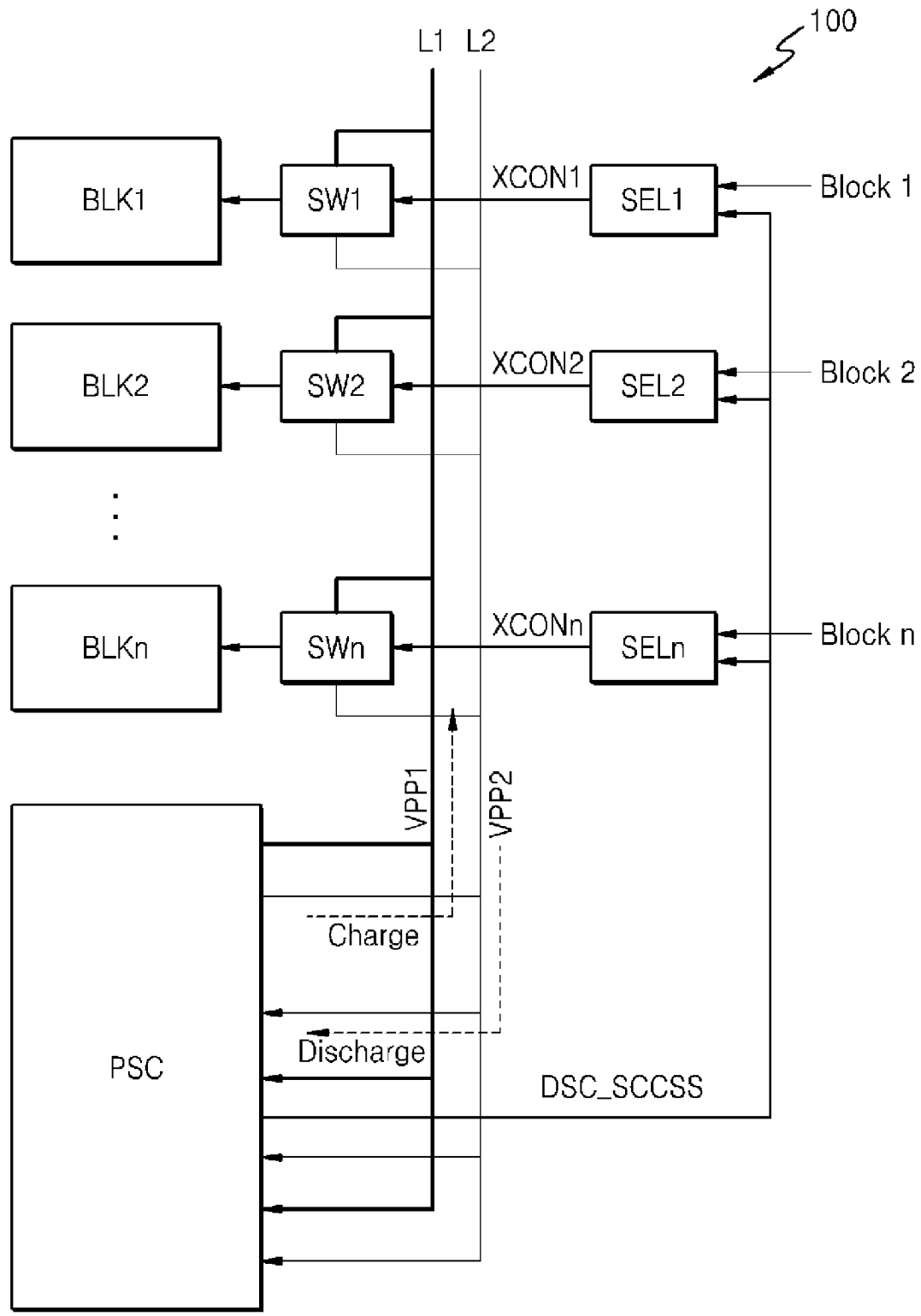
FIG. 1 is a block diagram of a Phase-change Random Access Memory (PRAM) according to an embodiment of the invention.

Hereinafter, the invention will be described more fully with reference to the accompanying drawings in which exemplary embodiments of the invention are shown. In the drawings, like reference numerals denote like elements.

FIG. 1 is a block diagram of a Phase-change Random Access Memory (PRAM) according to an embodiment of the invention. As shown therein, a PRAM semiconductor memory device 100 includes multiple memory blocks BLK1 through BLKn, switches SW1 through SWn coupled to the corresponding memory blocks BLK1 through BLKn, selectors SEL1 through SELn coupled to the corresponding switches SW1 through SWn, and a power supplying circuit PSC coupled to the switches SW1 through SWn and the selectors SEL1 through SELn.

The multiple memory blocks BLK1 through BLKn may be included in a memory cell array (not shown) of the semiconductor memory device 100.

In operation, the PSC generates a first voltage VPP1 and a second voltage VPP2 used in memory cells of the blocks BLK1 through BLKn. More preferably, the first voltage VPP1 may be a read voltage and/or a standby voltage, and the second voltage VPP2 may be a write voltage. Accordingly, the level of the second voltage VPP2 may be higher than that of the first voltage VPP1. The PSC will be described in more detail later.

Each of the multiple switches SW1 through SWn are connected to a first line L1 and a second line L2, the first line L1 transmitting the first voltage VPP1 and the second line L2 transmitting the second voltage VPP2. The switches SW1 through SWn apply at least one of the first voltage VPP1 and the second voltage VPP2 to corresponding memory blocks BLK1 through BLKn in response to corresponding control signals XCON1 through XCONn output from the corresponding selectors SEL1 through SELn. More preferably, the switches SW1 through SWn may be included in corresponding memory blocks BLK1 through BLKn.

As described above, the semiconductor memory device 100 applies a voltage VPP1 and/or VPP2 to the cell blocks BLK1 through BLKn by the power switches SW1 through SWn. This configuration reduces a load on an output terminal of the PSC. Accordingly, the rising/falling time of the second voltage VPP2 of the PSC decreases, and less current is consumed. The operating speed may also be improved.

Figure 2:
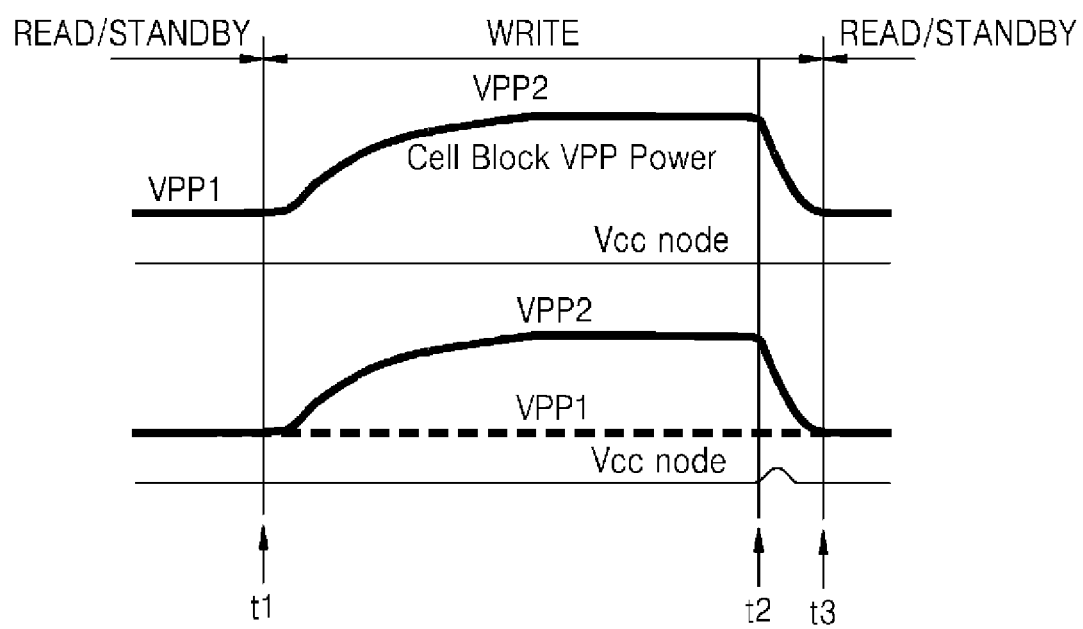
FIG. 2 is a waveform diagram illustrating the operation of the PRAM in FIG. 1.

FIG. 2 is a waveform diagram illustrating the operation of the PRAM in FIG. 1. For purposes of illustration only, we will describe the waveforms with reference to the switch SW1 and the memory block BLK1.

Prior to time t1, the first voltage VPP1 that corresponds to a read or standby READ/STBY operation is applied to the first line L1. During this same time period, the switch SW1 connects the first line L1 to memory block BLK1.

At time t1, the second voltage VPP2 that corresponds to a write operation WRITE is applied to the second line L2, and the switch SW1 connects the second line L2 to the memory block BLK1.

The write operation may be completed at time t2. Nevertheless, the switch SW1 continues to connect the second line L2 to the memory block BLK1 until the voltage level of the second line L2 is discharged to the voltage level of the first voltage VPP1 (e.g., until time t3).

At time t3, the first switch SW1 connects the first line L1 to the memory block BLK1.

In the embodiment illustrated in FIG. 2, a discharge voltage of the second voltage VPP2 has the same level as the first voltage VPP1; however, the invention is not limited thereto.

For example, in an alternative embodiment, the discharge voltage of the second voltage VPP2 may have a level associated with an external voltage VCC that is not equal to the first voltage VPP1.

As illustrated in FIG. 1, the operation of the switches SW1 through SWn are controlled by corresponding control signals XCON1 through XCONn. The control signals XCON1 through XCONn are generated by the corresponding selectors SEL1 through SELn in response to corresponding block selection signals Block 1 through Blockn and a discharge success signal DSC_SCCSS.

The block selection signals Block1 through Blockn may correspond to an external address associated with read and/or write commands. In embodiments of the invention, the selectors SEL1 through SELn may be included in corresponding switches SW1 through SWn.

With further reference to FIGS. 1 and 2, when the write operation is to be performed on memory block BLK1 (at time t1), the block selection signal Block1 is activated, the discharge success signal DSC_SCCSS is not activated, the selector SEL1 outputs the control signal XCON1 to the switch SW1 at a first logic level, and the switch SW1 connects the second line L2 to the memory block BLK1. This same connection state continues between time t2 and time t3.

When discharging of the second line L2 is completed at time t3, the discharge success signal DSC_SCCSS is activated, the selector SEL 1 outputs the control signal XCON1 at a second logic level, and the switch SW1 connects the first line L1 to the memory block BLK1.

Hereinafter, the configuration and operation of the PSC is described in more detail.

Figure 3:
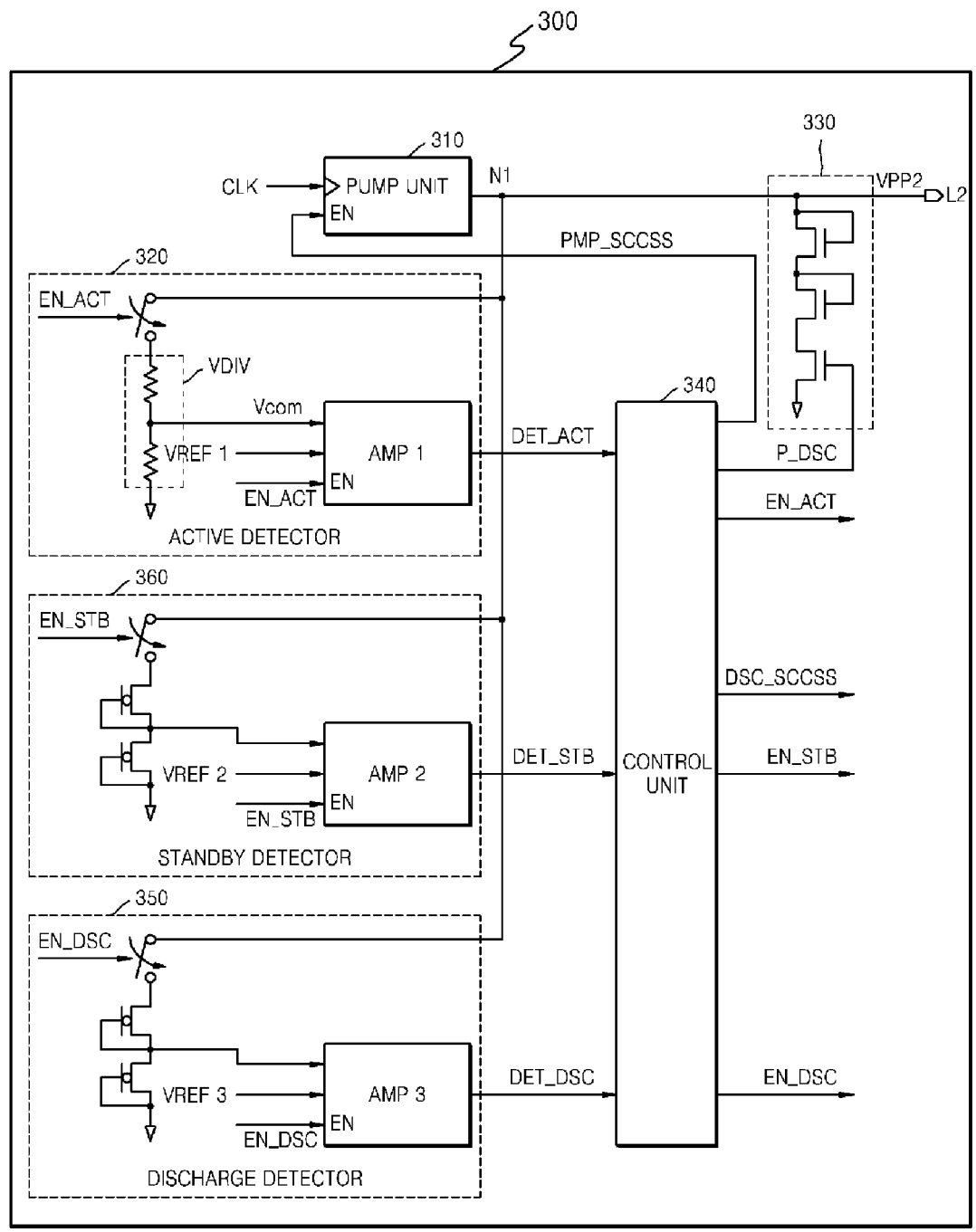
FIG. 3 is a block diagram of a portion of a power supplying circuit (PSC) according to an embodiment of the invention.

FIG. 3 is a block diagram of a portion of a power supplying circuit (PSC) according to an embodiment of the invention.

The PSC may include a first voltage generator (not shown) and a second voltage generator 300. The first voltage generator may apply the first voltage VPP1 to the first line L1. The second voltage generator may apply the second voltage VPP2 to the second line L2. For convenience of description, FIG. 3 illustrates only the second voltage generator 300. The first voltage generator performs a simple operation, and thus detailed description is omitted. In addition, the configuration and operation of the first voltage generator can be deduced from the configuration and operation of the second voltage generator 300.

Referring to FIG. 3, the second voltage generator 300 includes a voltage pump unit 310, a pump output detector 320, a discharging unit 330, and a control unit 340.

The voltage pump unit 310 pumps a clock signal CLK to the second voltage VPP2 and outputs the second voltage VPP2 to the second line L2.

The pump output detector 320 checks the voltage level of an output voltage of the voltage pump unit 310 (e.g., at node N1) and generates a pump output detection signal DET_ACT that indicates a voltage level difference between the output voltage and the second voltage VPP2. More preferably, the pump output detector 320 may include a voltage distributor VDIV and a comparator AMP1.

The voltage distributor VDIV may divide an output voltage of the voltage pump unit 310 into an arbitrary comparison voltage Vcom. The comparator AMP1 compares the comparison voltage Vcom with a reference voltage VREF1 in response to an operation enable signal EN_ACT. The pump output detection signal DET_ACT is the result of the comparison. The operation enable signal EN_ACT may be activated during the write operation.

The discharging unit 330 may discharge the voltage level of the second voltage VPP2 to the voltage level of the first voltage VPP1 in response to a discharge signal P_DSC. More preferably, the discharging unit 330 may include multiple transistors connected in series between the second line L2 and ground. The multiple transistors may be turned on in response to the discharge signal P_DSC.

The discharge signal P_DSC may be activated during the discharging period (e.g., between t2 and t3 in FIG. 2). The discharging period may begin when the pump control signal PMP_SCCSS activated. The discharging period may end when the discharge success signal DSC_SCCSS is activated.

The control unit 340 may include a first controller (not shown). The first controller (not shown) may generate a pump control signal PMP_SCCSS, which determines whether to pump the voltage pump unit 310, in response to the pump output detection signal DET_ACT. When the output voltage of the voltage pump unit 310 and the voltage level of the second voltage VPP2 are equal, the voltage pump unit 310 completes its operation in response to the pump control signal PMP_SCCSS. Otherwise, voltage pump unit 310 continues a pumping operation.

The control unit 340 may further include a second controller (not shown). The second controller outputs the discharge success signal DSC_SCCSS or the discharge signal P_DSC according to a logic level of a discharge voltage detection signal DET_DSC. The discharge voltage detection signal DET_DSC may be generated by a discharge detector 350.

The discharge detector 350 checks the voltage level of the second line L2 during discharging of the second voltage VPP2 and outputs the discharge voltage detection signal DET_DSC. The discharge detector 350 may include a voltage distributor and a comparator.

The discharge voltage detection signal DET_DSC has a first logic level when the voltage level of the second line L2 has discharged to the same level as a voltage level of the first voltage VPP1. The discharge voltage detection signal DET_DSC has a second logic level when the voltage level of the second line L2 is higher than the voltage level of the first voltage VPP1.

When the discharge voltage detection signal DET_DSC has the first logic level, the second controller may output the discharge success signal DSC_SCCSS. When the discharge voltage detection signal DET_DSC has the second logic level, the second controller may output the discharge signal P_DSC.

The second voltage generator 300 may further include a standby detector 360. The standby detector 360 compares the output of the voltage pump unit 310 to a comparison voltage VREF 3 and outputs the resulting standby detection signal DET_STB. Thus, the PSC according to the current embodiment of the invention checks the voltage level of the second voltage VPP2 during a standby period (e.g., after time t3) and controls inappropriate rising of the second voltage VPP2 during the standby period.

Figure 4:
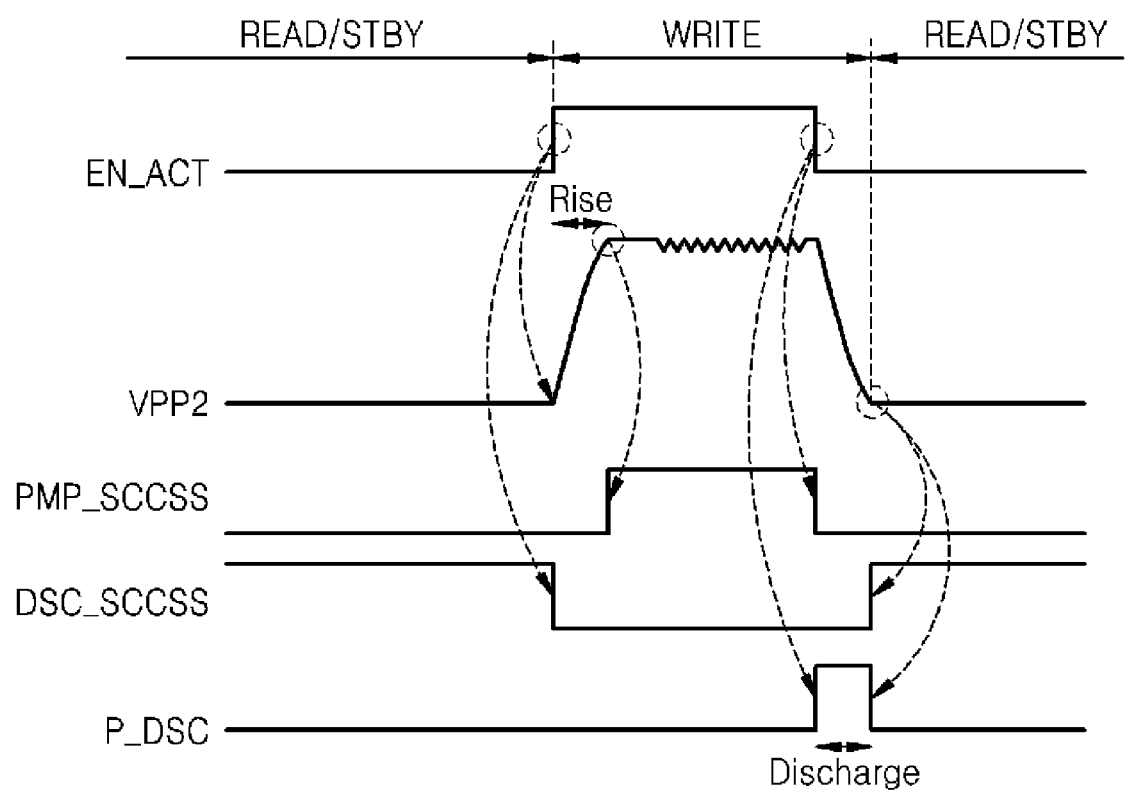
FIG. 4 is a timing diagram for signals illustrated in FIG. 3.

FIG. 4 is a timing diagram for signals illustrated in FIG. 3.

Referring to FIGS. 3 and 4, when the write operation is required, the operation enable signal EN_ACT is transitioned to a logic high. In response, the voltage pump unit 310 starts the pumping operation. When the output voltage of the voltage pump unit 310 reaches a target level (the voltage level of the second voltage VPP2), the pump control signal PMP_SCCSS is activated to a logic high and a program (write) operation is performed on the associated memory cells.

When the write operation is completed, the pump control signal PMP_SCCSS is transitioned to a logic low. Additionally, the discharge signal P_DSC is transitioned to a logic high so that the second voltage VPP2 is discharged to the voltage level of the first voltage VPP1. When discharging is completed, the discharge success signal DSC_SCCSS is transitioned to a logic high. The write operation for the memory cells is thus completed, and the memory cells are in a read or standby state.

While the invention has been particularly shown and described with reference to exemplary embodiments thereof, it will be understood by those of ordinary skill in the art that various changes in form and details may be made therein without departing from the spirit and scope of the present invention as defined by the following claims. For instance, In alternative embodiments of the invention, the switches SW1 through SWn may not be included in corresponding memory blocks. Moreover, in alternative embodiments, the write and read/standby voltages may not be applied according to memory blocks. Furthermore, in alternative embodiments of the invention, discharging may not be performed. Features of the above-described embodiments may therefore be utilized separately or in combinations not expressly illustrated.

What is claimed is:

1. A semiconductor memory device comprising:
   a memory cell array having a plurality of memory blocks;
   a plurality of switches, each of the plurality of switches connected to a corresponding one of the plurality of memory blocks;
   a plurality of selectors, each of the plurality of selectors coupled to a corresponding one of the plurality of switches, each of the selectors configured to output a control signal to the corresponding one of the plurality of switches in response to a block selection signal and a discharge success signal; and
   a power supplying circuit (PSC) coupled to each of the plurality of switches by a first line and a second line, the PSC further coupled to the plurality of selectors by a control line, the PSC configured to output a first voltage to the first line and a second voltage to a second line.

2. The device of claim 1, wherein each of the plurality of switches is integrated into a corresponding one of the plurality of memory blocks.

3. The device of claim 1, wherein the PSC includes:
   a first voltage generator configured to output the first voltage to the first line; and
   a second voltage generator configured to output the second voltage to the second line.

4. The device of claim 3, wherein the second voltage generator includes:
   a voltage pump unit configured to output the second voltage based on a clock signal and a pump control signal;
   a pump output detector coupled to the voltage pump unit, the pump output detector configured to output a pump output detection signal;
   a discharging unit coupled to the voltage pump unit, the discharging unit configured to discharge a level of the second voltage to a predetermined level in response to a discharge signal; and
   a control unit coupled to the voltage pump unit, the pump output detector, and the discharging unit, the control unit configured to output the pump control signal based on the pump output detection signal, the control unit further configured to output the discharge signal.

5. The device of claim 4, wherein the predetermined level is equal to one of a level of the first voltage and a level of an external supply voltage.

6. The device of claim 4, wherein the pump output detector comprises:
   a voltage distributor configured to divides an output of the voltage pump unit into a comparison voltage; and
   a comparator configured to compare the comparison voltage with a reference voltage to output, the comparator configured to output the pump output detection signal based on the comparison and an operation enable signal.

7. The device of claim 4, wherein the discharging unit comprises a plurality of transistors connected in series between the second line and a ground voltage.

8. The device of claim 4, wherein the second voltage generator further comprises a discharge detector coupled to an output of the voltage pump, the discharge detector configured to output a discharge voltage detection signal to the control unit.

9. The device of claim 8, wherein the control unit comprises:
   a first controller configured to output the pump control signal; and
   a second controller configured to output a discharge success signal based on the discharge voltage detection signal.

10. The device of claim 1, wherein the block selection signal is based on a memory address associated with one of a write function and a read function.

11. The device of claim 1, wherein the first voltage is one of a read voltage and a standby voltage, and wherein the second voltage is a write voltage.

12. The device of claim 1, wherein a level of the second voltage is greater than a level of the first voltage during a write enable state.

13. The device of claim 1, wherein the semiconductor memory device is a Phase-change Random Access Memory (PRAM).

14. A power supply circuit (PSC) adapted for use in a Phase-change Random Access Memory (PRAM), the PSC comprising:
   a first voltage generator configured to output a first voltage to a first terminal; and
   a second voltage generator configured to output a second voltage to a second terminal, the second voltage generator including:
      a voltage pump unit configured to output the second voltage based on a clock signal and a pump control signal;
      a pump output detector coupled to the voltage pump unit, the pump output detector configured to output a pump output detection signal; and
      a discharging unit coupled to the voltage pump unit, the discharging unit configured to discharge a level of the second voltage to a predetermined level in response to a discharge signal.

15. The PSC of claim 14, wherein the pump output detector comprises:
   a voltage divider configured to output a comparison voltage based on an output of the voltage pump unit; and
   a comparator configured to compares the comparison voltage with a reference voltage to generate the pump output detection signal in response to an operation enable signal.

16. The PSC of claim 14, wherein the discharging unit comprises a plurality of transistors connected in series between the second line and a ground voltage.

17. The PSC of claim 14, wherein the second voltage generator further includes a first controller, the first controller configured to generate the pump control signal in response to the pump output detection signal.

18. The PSC of claim 17, wherein the second voltage generator further includes a discharge detector coupled to an output of the voltage pump, the discharge detector configured to output a discharge voltage detection signal.

19. The PSC of claim 18, wherein the control unit further comprises a second controller configured to output a discharge success signal based on the discharge voltage detection signal.

20. The PSC of claim 14, wherein the first voltage is one of a read voltage and a standby voltage, and wherein the second voltage is a write voltage.

* * * * *